US009368394B1

(12) United States Patent
Hung et al.

(10) Patent No.: US 9,368,394 B1
(45) Date of Patent: Jun. 14, 2016

(54) DRY ETCHING GAS AND METHOD OF MANUFACTURING SEMICONDUCTOR DEVICE

(71) Applicant: TAIWAN SEMICONDUCTOR MANUFACTURING COMPANY LTD., Hsinchu (TW)

(72) Inventors: Yu-Li Hung, Tainan (TW); Te-Ming Kung, Taichung (TW); Chih-Hao Chen, Hsinchu (TW); Kei-Wei Chen, Tainan (TW); Ying-Lang Wang, Tai-Chung County (TW); Hung Jui Chang, Changhua County (TW); Horng-Huei Tseng, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/674,457

(22) Filed: Mar. 31, 2015

(51) Int. Cl.
*H01L 21/00* (2006.01)
*H01L 21/768* (2006.01)
*H01L 21/311* (2006.01)
*H01L 21/02* (2006.01)

(52) U.S. Cl.
CPC .... *H01L 21/76802* (2013.01); *H01L 21/02532* (2013.01); *H01L 21/02664* (2013.01); *H01L 21/31116* (2013.01); *H01L 21/31144* (2013.01)

(58) Field of Classification Search
CPC ............... H01L 21/76802; H01L 21/31144; H01L 21/31116; H01L 21/02532; H01L 21/02664
See application file for complete search history.

(56) References Cited

U.S. PATENT DOCUMENTS 7,365,021 B2 * 4/2008 Kim .................. H01L 21/31111 257/E21.251
7,456,086 B2 * 11/2008 Tegen ............... H01L 21/31111 257/E21.219

* cited by examiner

*Primary Examiner* — Richard Booth
(74) *Attorney, Agent, or Firm* — WPAT, P.C., Intellectual Property Attorneys; Anthony King (57) ABSTRACT

The present disclosure provides a method of manufacturing a semiconductor device. The method includes providing a semiconductor substrate; forming a conductive region at least partially in the semiconductor substrate; forming a dielectric layer over the substrate; forming a hard mask over the dielectric layer, the hard mask having an opening over the conductive region; dry etching the dielectric layer by a first etching gas to form a recessed feature, wherein a surface of the conductive region is therefore exposed at a bottom of the recessed feature, and a byproduct film is formed at an inner surface of the recessed feature; and dry etching the dielectric layer by a second etching gas, wherein the second etching gas chemically reacts with the byproduct film and the conductive region, and a sacrificial layer is therefore built up around the bottom of the recessed feature.

20 Claims, 13 Drawing Sheets

DRY ETCHING GAS AND METHOD OF MANUFACTURING SEMICONDUCTOR DEVICE

BACKGROUND

Solid state devices are typically formed by depositing, growing, patterning and etching a series of layers. Different layers may comprise conducting, semiconducting or insulating material. Typically, such layers are anisotropically etched to form the various elements of a solid state device. Anisotropic etches may also be used to remove layers without damaging previously formed elements. An anisotropic etch may refer to a dry etch. A dry etch may be a reactive ion etch (RIE) or an argon sputtering operation. A problem with anisotropic etches, however, is that they often leave a residual layer of byproducts. These byproducts may be contaminants that interfere with later semiconductor processing such as silicide formation.

As a result of that, a wet etch is therefore combined to the anisotropic etching operation. A wet etch may be performed subsequent to the anisotropic etching operation to remove the unwanted residual layer. Unfortunately, in addition to the byproducts, a chemical wet etching agent may also remove important parts that should not be removed. Therefore, a novel mechanism to mitigate aforementioned issues during etching operation has become an urgent need in fields pertinent to semiconductor manufacturing industry.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The present disclosure is explained by a semiconductor device manufacturing operation. Specifically, said semiconductor device manufacturing operation described in the following paragraphs particularly focuses on a mechanism to etch a contact hole for coupling a source and/or a drain (S/D) region of a metal gate device to other devices. Several embodiments and diagrams associated with fabrication processing of the semiconductor device are provided, and pertinent etching environment is illustrated as well. It will be understood that the method and the etching gas of the disclosure may be used for fabrication of other types of solid state devices and for improving other types of later semiconductor processing.

Nowadays, combined dry and wet etch is a popular way to improve etching results. As described in more detail below, the combined dry and wet etch provides a clean and mostly anisotropic etch that removes a predetermined region from a main body of semiconductor without leaving a residual layer of contaminants on an etched surface since the residual layer of contaminants would interfere with later semiconductor processing. The duration of the wet etch is usually relatively short in order to prevent the inner surface from being impaired by the corrosive wet etching agent, and also to avoid undercut profile. The concept of the disclosure is to provide a method to produce an extra sacrificial layer at a time before a wet etch operation is started. More specifically, the sacrificial layer may be produced at a specified location approximately by the end of a dry etching operation. Under a scenario where a recessed feature surrounded by multiple vertically-stacked dielectric layers is formed by a dry etching operation, interface between adjacent dielectric layers may be vulnerable and are likely to be eroded when introducing wet etching agent into the recessed feature. The wet etching agent may penetrate all the way along the interface to damage other components, e.g., a gate, at the other end of the dielectric layers. Accordingly, the disclosed method protects the specified location, such as a bottom of a contact hole, from being penetrated and effectively improves an overall device yield.

Figure 1:
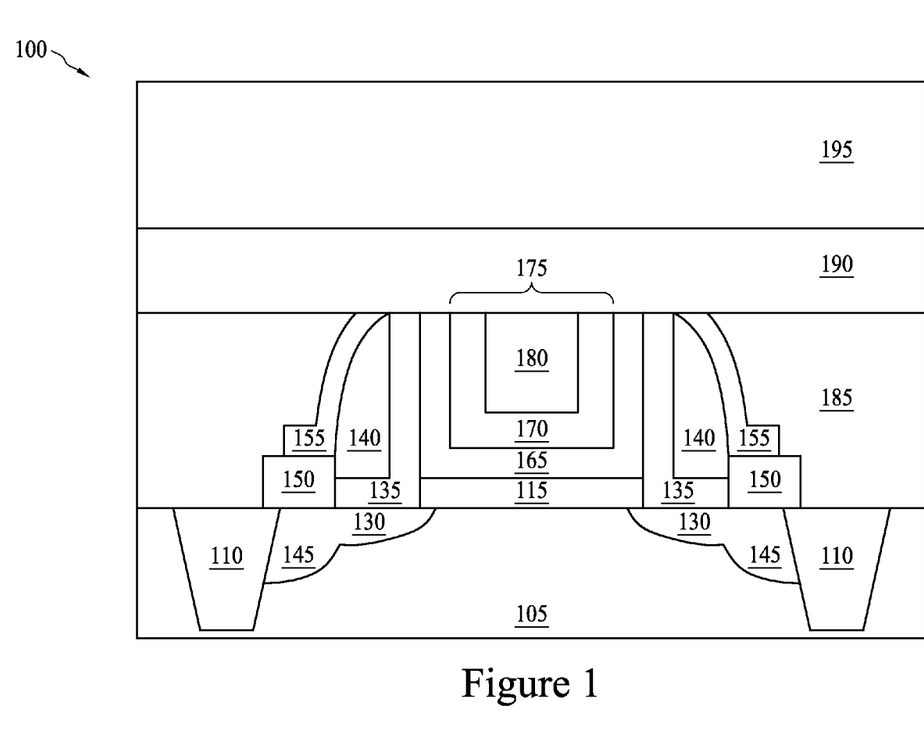
FIG. 1 illustrates a cross-sectional view of a metal gate structure for a Field Effect Transistor (FET)

FIG. 1 illustrates a cross-sectional view of a metal gate structure for a Field Effect Transistor (FET) 100. The FET 100 includes a substrate 105 having shallow trench isolation (STI) features 110 formed therein. The substrate 105 may comprise a silicon or other semiconductor substrate, and may be a silicon-on-insulator (SOI) or other semiconductor-on-insulator substrate. The STI 110 may be formed by etching or otherwise forming a recess in the substrate 105 and subsequently filling the recess with silicon dioxide and/or another dielectric material, possibly followed by a chemical-mechanical-polishing (CMP) or other planarization steps. An oxide layer 115 is formed in between the substrate 105 over the substrate 105. The oxide layer 115 may be grown over the substrate 105, such as by thermal oxidation resulting from exposing the substrate 105 to an oxidizing ambient at an elevated temperature.

Lightly doped source/drain regions 130 are formed in the substrate 105 on opposing sides of a gate electrode 175, and oxide liners 135 are formed spanning sidewalls of the gate electrode 175. Spacers 140 are formed on the liners 135 on opposing sides of the gate electrode 175. Heavily doped source/drain regions 145 are formed in the substrate 105 on opposing sides of the gate electrode 175 outside the spacers 140. The source/drain regions 130, 145 may be formed by implanting ions into the substrate 105, followed by an appropriate annealing process. The oxide liners 135 and spacers 140 may be deposited or otherwise formed. The spacers 140 may comprise one or more layers of silicon nitride and/or other materials.

Silicide contacts 150 are formed on the heavily doped source/drain regions 145, and an etch stop layer 155 is formed over the silicide contacts 150 and the spacers 140. The etch stop layer 155 may be deposited or otherwise formed. The etch stop layer 155 may comprise silicon dioxide, hafnium dioxide, silicon carbide, carbon-doped silicon oxide, carbon-doped silicon nitride, and/or other materials. A high-k dielectric layer 165 is formed over the oxide layer 115, including spanning the sides of the spacer liners 135. A metal layer 170 is then formed over the high-k dielectric layer 165, having a profile conforming to the high-k dielectric layer 165. The high-k dielectric layer 165 may be deposited or otherwise formed, and may comprise hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and/or other materials. The metal layer 170 may be deposited or otherwise formed, and may substantially comprise hafnium, zirconium, titanium, tantalum, aluminum, a metal carbide, ruthenium, palladium, platinum, cobalt, nickel, a conductive metal oxide, and/or other materials.

A second metal layer 180 is formed over the portion of the metal layer 170. The second metal layer 180 may be deposited or otherwise formed, and may substantially comprise hafnium, zirconium, titanium, tantalum, aluminum, a metal carbide, ruthenium, palladium, platinum, cobalt, nickel, a conductive metal oxide, and/or other materials. A first insulating layer 185, a second insulating layer 190 and a third insulating layer 195 are deposited over the substrate 105.

Figure 2:
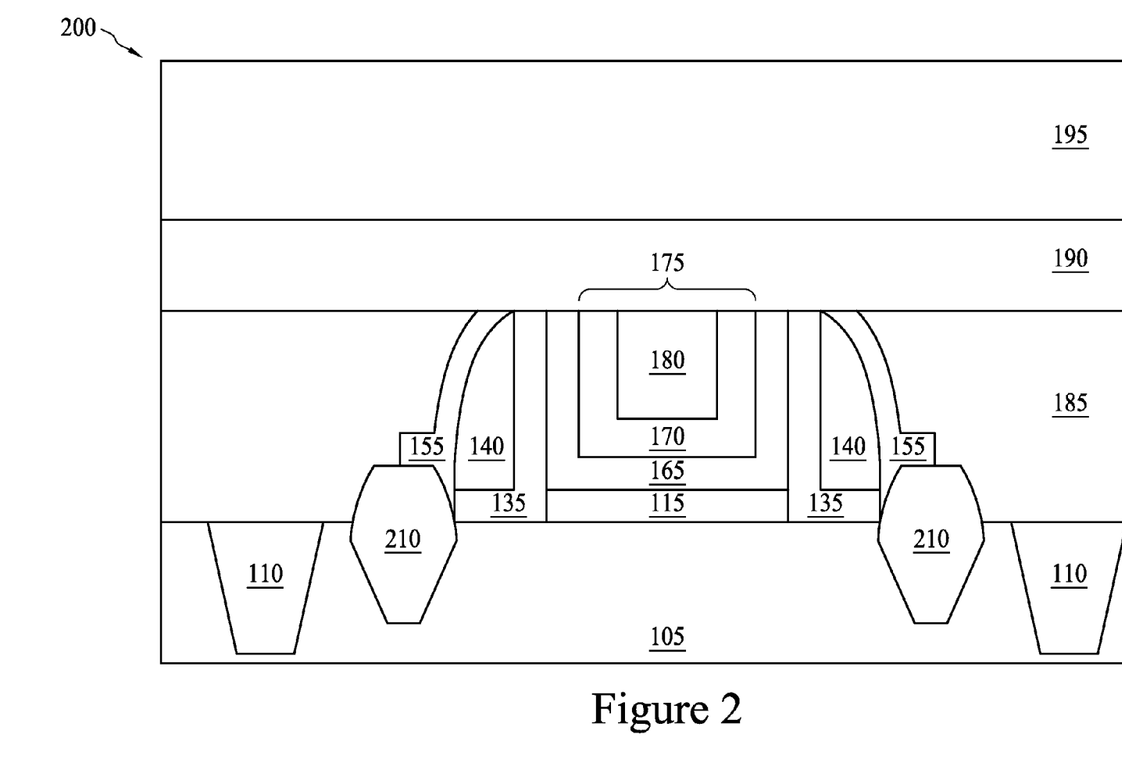
FIG. 2 illustrates a cross-sectional view of a metal gate structure for another FET.

In some embodiments, the formation of the source/drain structure may employ alternative operations different from FIG. 1. FIG. 2 illustrates a cross-sectional view of a metal gate structure for a FET 200. As can be seen in FIG. 2, the source/drain regions are epitaxy structures 210. The epitaxy structures 210 may be formed at least partially in the semiconductor substrate 105 by employing an epitaxy regrowth operation. The remaining parts of the FET 200 are similar to those of the FET 100, and the details are omitted here for brevity.

Figure 3:
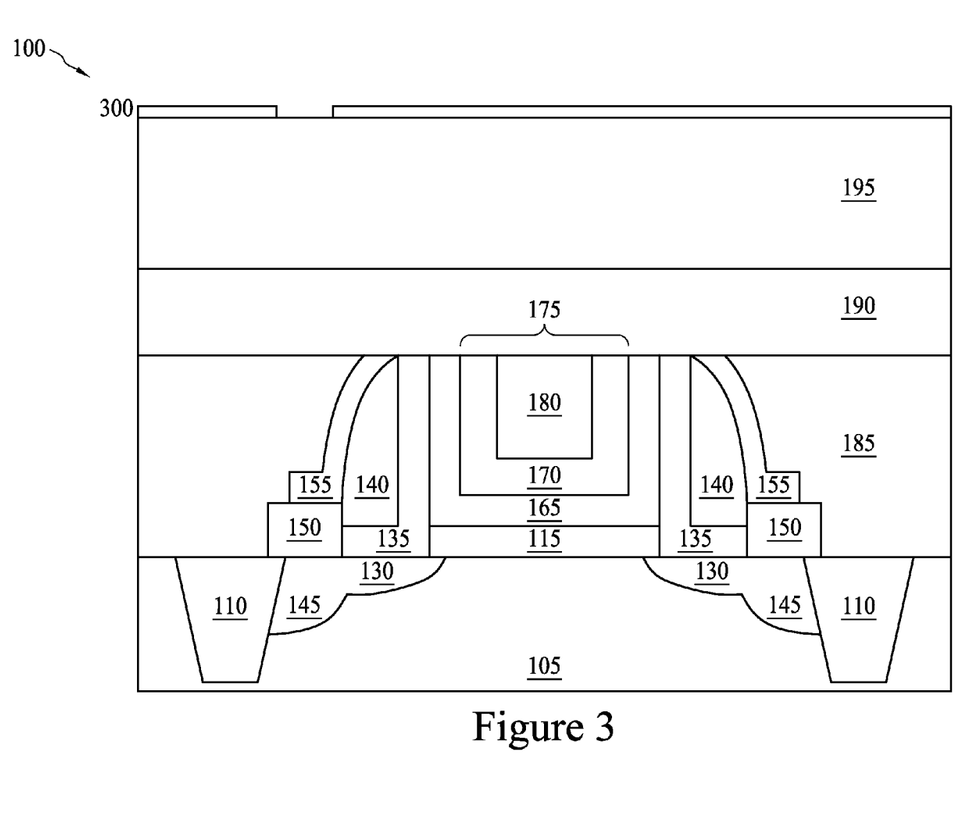
FIG. 3 illustrates a cross-sectional view of the FET in a subsequent stage of manufacture according to one or more aspects of the present disclosure.
Figure 4:
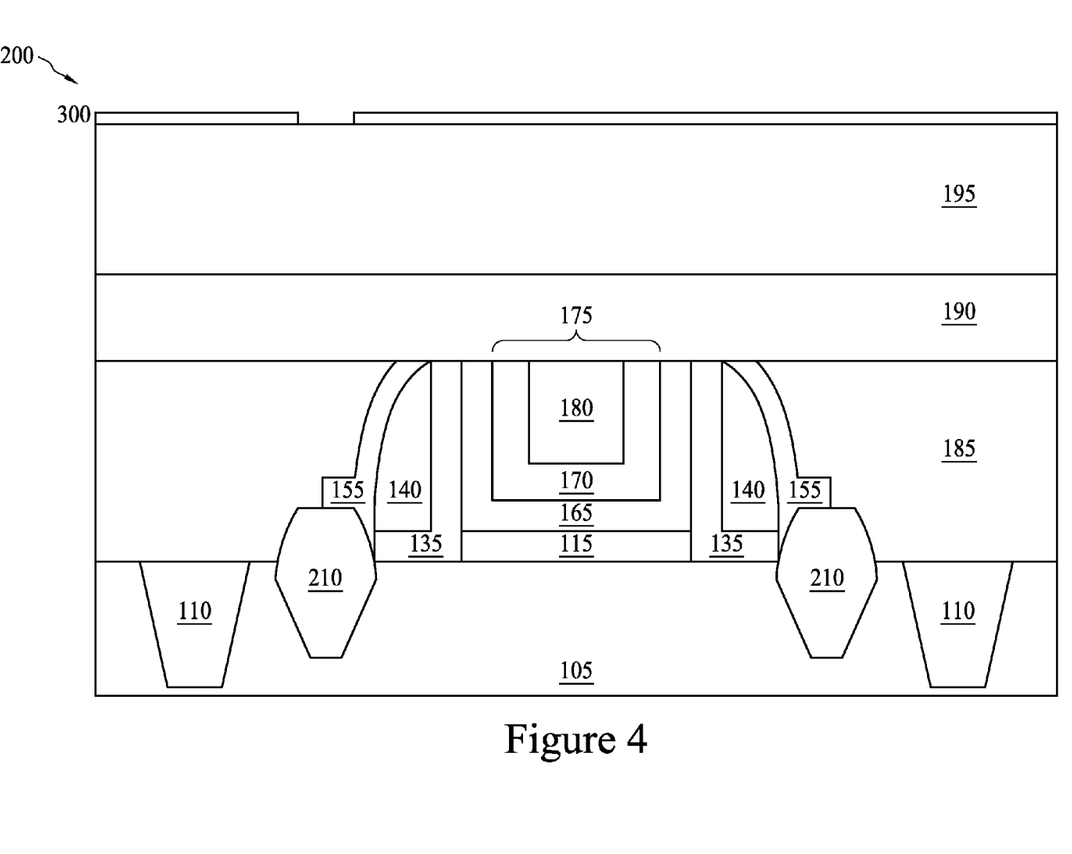
FIG. 4 illustrates a cross-sectional view of the another FET in a subsequent stage of manufacture according to one or more aspects of the present disclosure.

Subsequently, it may be required to have a vertical plug to contact the source/drain regions 145 and thereby connecting the FET 100 with one another and/or other components of the FET 100. FIG. 3 illustrates a cross-sectional view of the FET 100 in a subsequent stage of manufacture according to one or more aspects of the present disclosure. A hard mask 300 is formed upon the third insulating layer 195 of the FET 100. The hard mask 300 at least has an opening right above the left silicide contacts 150 of the heavily doped source/drain regions 145 and is prepared for anisotropic etch in a vertical direction. In this way, a vertical contact hole can be obtained in the following operation without destroying the portions of the third insulating layer 195 covered by the hard mask 300. The formation of hard mask 300 on the FET 200 is illustrated in FIG. 4. The details of the aforesaid operations are substantially identical to that described for FET 100 in FIG. 3 and can be referred thereto.

Dielectric etch is mainly for creating contact and via holes for interconnections between different layers of conductors. Normally, the etch operation that creates the contact holes for the source/drain regions 145 is called contact etch. In this embodiment, it needs to etch the third insulating layer 195, the second insulating layer 190 and the first insulating layer 185, and ends on the silicide contacts 150 of the source/drain regions 145. The dielectric etching operation uses fluorine chemistry with heavy ion bombardment may be referred to reactive ion etch (RIE). RIE is one type of so called dry etch. RIE may be understood as ion assistant etch, since the ions in this etch operation are not necessarily reactive. Dry etch also includes a pure physical etch, such as argon sputtering, which may be employed in the operation as described in the later paragraphs.

Figure 5:
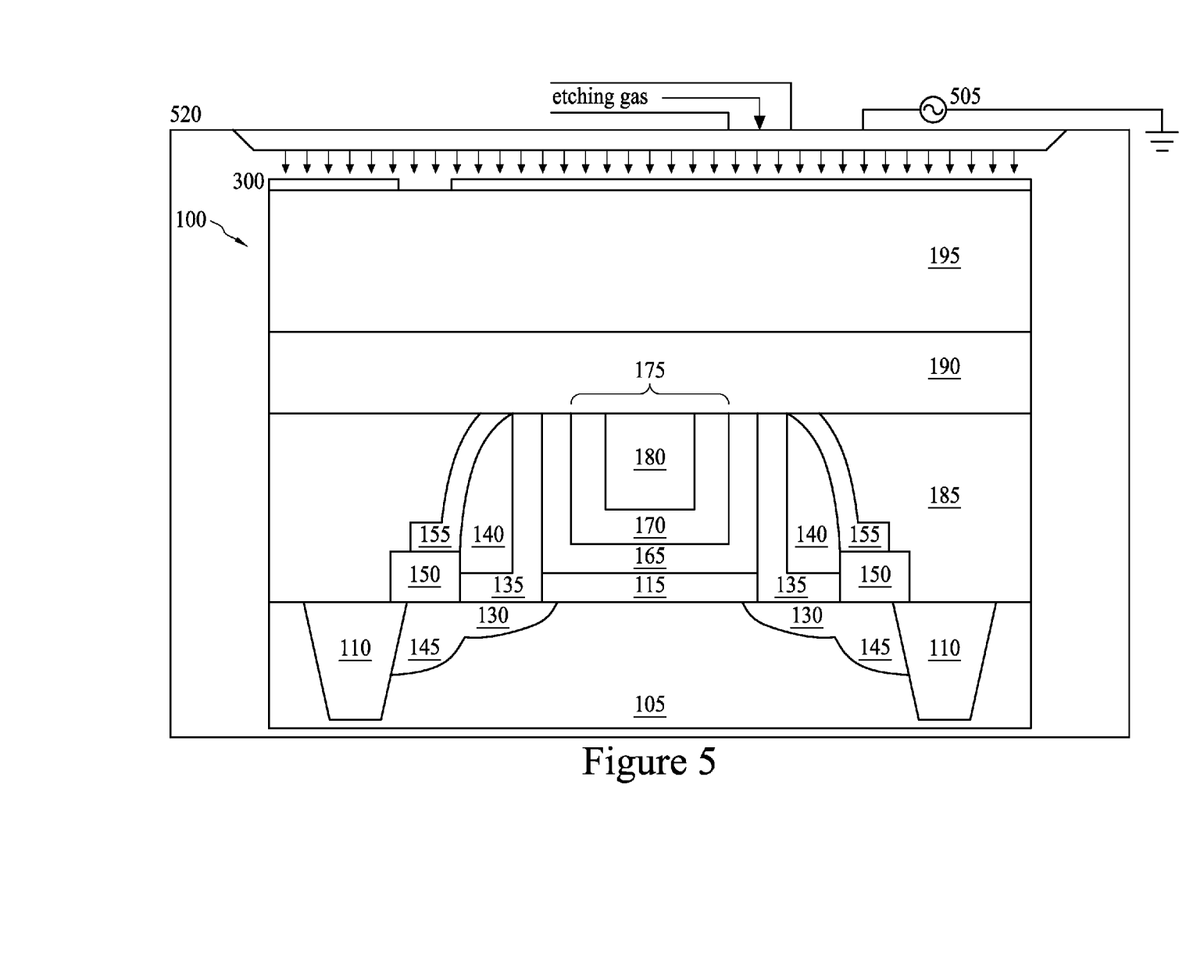
FIG. 5 illustrates a cross-sectional view of a plasma etch system according to one or more aspects of the present disclosure.

The RIE is employed to achieve anisotropic etch profile by utilizing a plasma etch system. FIG. 5 illustrates a cross-sectional view of a plasma etch system according to one or more aspects of the present disclosure. The FET 100 sits on a heated plate (not shown in FIG. 5) of a plasma chamber 520. An RF power 505 is used to strike a glow discharge plasma. Some of the etchant molecules dissociate in the plasma from the impact of collisions with electrons, which generate free radicals. The free radicals then diffuse and reach a surface of the FET 100, and are absorbed on the surface. With the help of the ion bombardment, these free radicals react with the surface atoms or molecules rapidly and form byproducts. The etch rate can be adjusted through configuring the RF power 505 and pressure inside the plasma chamber 520. For example, the etch rate can be increased by increasing the RF power 505 and decreasing the pressure inside the plasma chamber 520. Etching gases for the plasma etch system of FIG. 5 may be fluorocarbon gases, such as $CF_4$, $CHF_3$, $C2F_6$, and $C_3F_8$. The etching gases may further include other additive gases such as oxygen or ozone. Similar plasma etch system may be also applied to the FET 200, and a figure regarding the FET 200 in a plasma etch system is omitted here for brevity.

Figure 6:
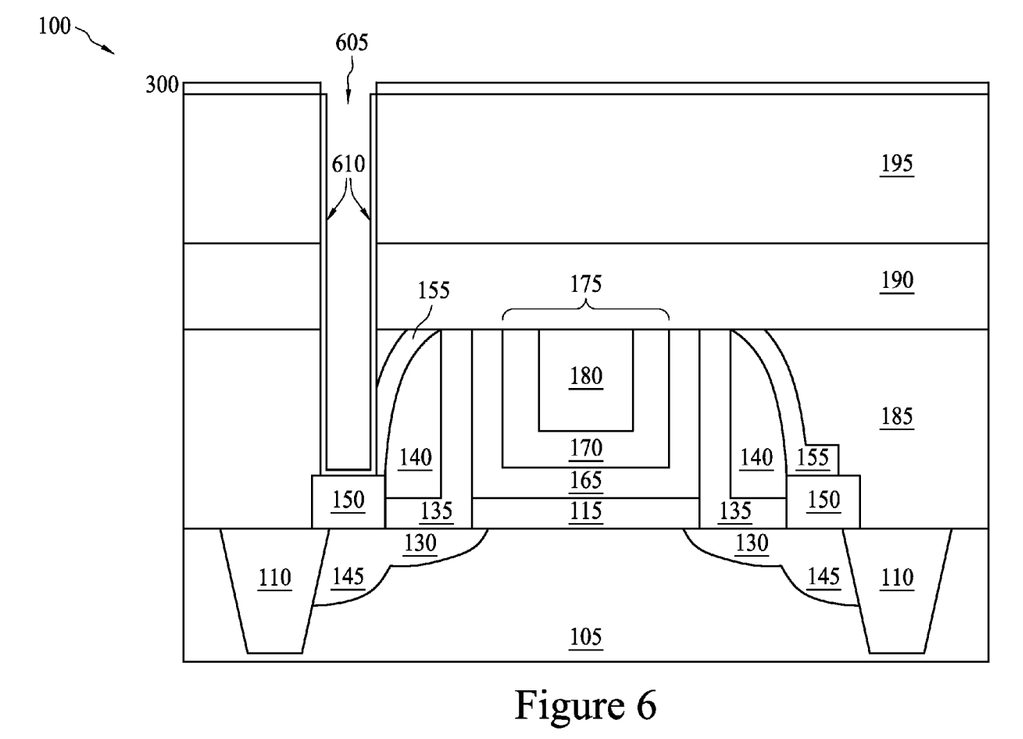
FIG. 6 illustrates a cross-sectional view of the FET in a dry etch stage of manufacture according to one or more aspects of the present disclosure.
Figure 7:
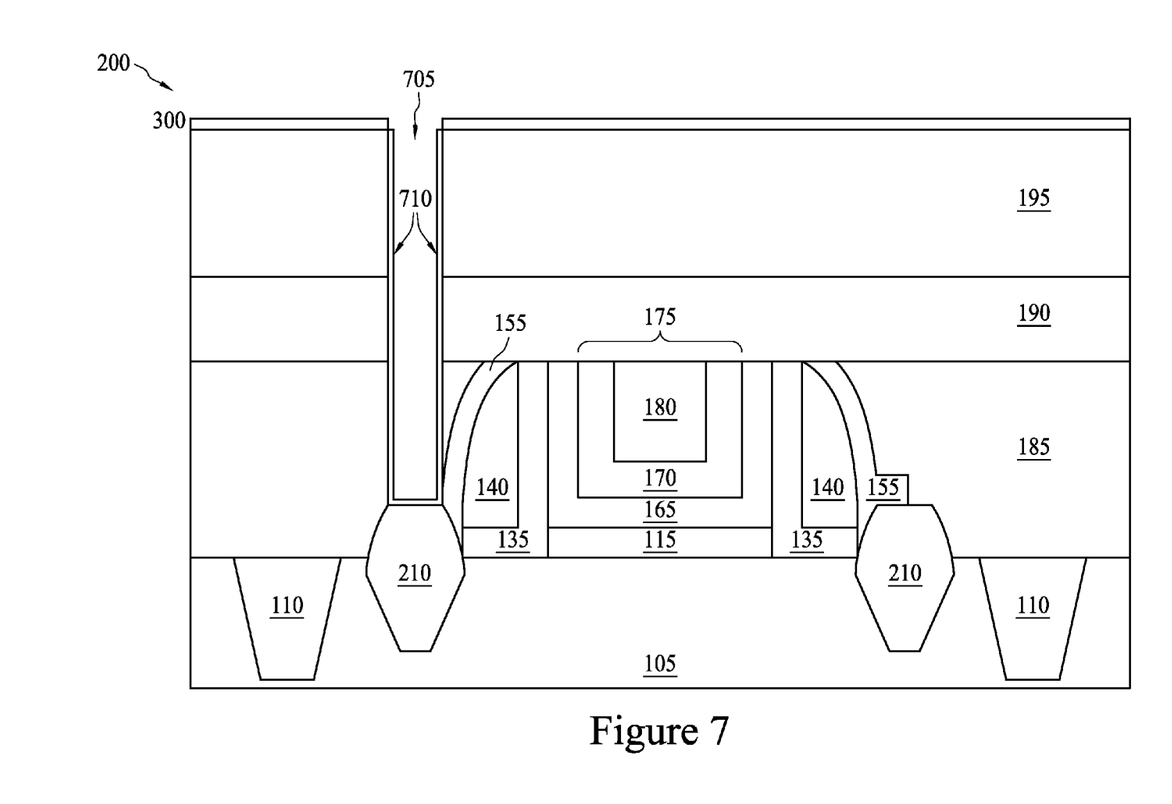
FIG. 7 illustrates a cross-sectional view of the another FET in a dry etch stage of manufacture according to one or more aspects of the present disclosure.

The energetic ion bombardment breaks the chemical bonds between the atoms on the surface of the FET 100. Because the ion bombardment is substantially perpendicular to the surface of the FET 100, the etch rate in the direction is much higher than that in the horizontal. Therefore, an anisotropic etch profile can be achieved. Surface atoms with dangling bonds are vulnerable to the etchant free radicals. They are easier to bond with the etchant radicals to produce byproducts. Volatile byproducts can desorb from the surface and be pumped out from the plasma chamber 520. Non-volatile byproducts remain on the surface around which they are generated from. FIG. 6 illustrates a cross-sectional view of the FET 100 in a dry etch stage of manufacture according to one or more aspects of the present disclosure. A contact hole 605 etched by the RIE with the etching gas including fluorocarbon gases and $O_2$ and/or $O_3$ reaches to the silicide contacts 150. A thin residue film 610 as a non-volatile byproduct of the etching operation is formed over the inner wall surface of the recessed hole 605 and over the exposed surface of the silicide contacts 150 at a bottom of the recessed contact hole 605. The non-volatile byproduct may include CHO-based polymer formed through high power reactions between the component elements of the etching gas and the silicide. A same or similar etching operation performed upon the FET 200 is depicted in FIG. 7. As shown in FIG. 7, a thin residue film 710 such as a non-volatile byproduct of the etching operation is formed over an inner wall surface of a recessed contact hole 705.

Please note that flow rates and temperature of the etching gases are not limited in the disclosure. In practice, the flow rates of the etching gases may be configured in accordance with the desired etch rate and/or further considerations regarding chemical reactions and the plasma chamber environment. In addition to the flow rates and temperature, the associated apparatus of the etch system is not limited to the apparatus depicted in FIG. 5. Any other feasible etch systems that can achieve the same or similar objective may also be employed by the disclosure and should fall into the scope of the disclosure.

After the anisotropic contact hole 605 is etched to a predefined depth, the inner surface is substantially covered by the residue film 610. As mentioned above, the residue film 610 requires to be removed before the next deposition operations by wet etch. An anisotropic tapered profile is typically the favored profile for contact and via etch, because the tapered contact and via hole has a larger arriving angle and is easier for the next tungsten Chemical Vapor Deposition (CVD) operation to fill without voids. Chemical wet etch operation generates an isotropic profile, which causes undercut at the lower portion of the contact and via hole and introduces critical dimension loss. In addition to the undercut profile, the contact hole 605 is in contact with several layer boundaries around the bottom of the contact hole 605, as can be seen from FIG. 4. For example, there is a layer boundary between the spacer 140 and the liner 135. Another boundary is located in between the liner 135 and the source/drain regions 130, 145. Still another boundary is located in between the first insulating layer 185 and the second insulating layer 190. The boundary or interface of adjacent layers may be vulnerable and are likely to be eroded when introducing wet etching agent into the contact hole 605. To put together all the facts, it is found that the wet etching agent may have a great chance to penetrate any boundary or interface laterally connecting the contact hole 605 and the gate electrode 175 to erode and damage the gate electrode 175. Consequently, the gate electrode 190 may be partially missing or completely removed by the wet etching agent.

In order to mitigate the undercut profile and reduce the possibility to the metal gate erosion, a temporary sacrificial layer is provided in the subsequent procedure. Please refer to FIG. 8, which illustrates a cross-sectional view of the FET 100 in an operation of forming the sacrificial layer according to one or more aspects of the present disclosure. A temporary sacrificial layer 805 is formed around the bottom of the contact hole 605. The sacrificial layer 805 is acid resistant against the wet etching agent used to chemically etch and remove the thin residue film 610 in FIG. 6. In some embodiments, the temporary sacrificial layer 805 then will be partially removed by non-chemical etch procedure after the wet etch stage, so that when filling conductive materials into the contact hole 605, the conductive materials may electrically connect to the silicide contacts 150 of the heavily doped source/drain regions 145 of the FET 100.

In this embodiment, an operation to form the sacrificial layer 805 is provided, but this is not a limitation of the disclosure. The sacrificial layer 805 is formed by a second dry etching operation after the first dry etching operation. The first dry etching operation refers to the dry etching operation for producing the contact hole 605 previously described, and the first dry etching operation precedes the second dry etching operation. The second dry etching operation may be performed in the same etch system as shown in FIG. 5. Please note that the first dry etching operation and the second dry etching operation may not be executed consecutively, and there may be other dry etching operations between the first dry etching operation and the second dry etching operation. The second etching operation may be performed in the plasma chamber 520 as shown in FIG. 5 with an etchant different from the etching gas employed by the first dry etching operation. In some embodiments, the dry etching gas may include $H_2$ and $N_2$. In this embodiment, the flow rate of the $H_2$ gas may be about 100 sccm, and the flow rate of the $N_2$ gas may be about also 100 sccm. In some embodiments, the flow rate of the $H_2$ gas may be in a range of from about 80 sccm to about 150 sccm. In some embodiments, the flow rate of the $N_2$ gas may be in a range of from about 80 sccm to about 150 sccm. The temperature of the etch system may be configured to be about 50° C. In some embodiments, the temperature of the etch system may be configured to be in a range of from about 40° C. to about 60° C.

Figure 8:
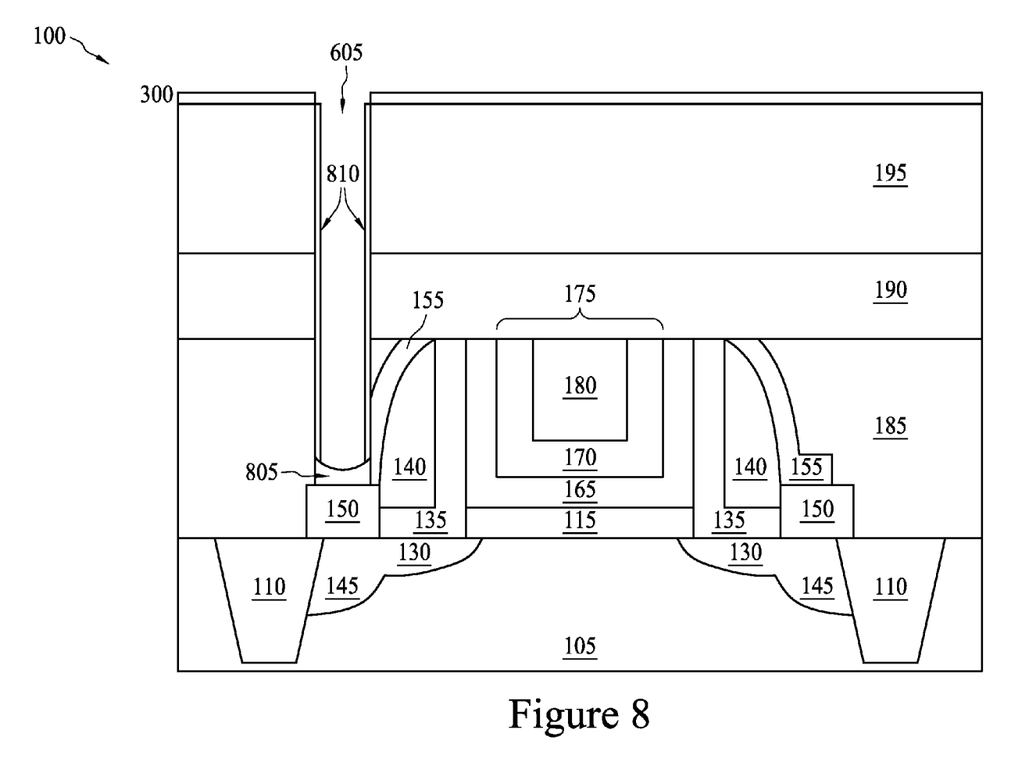
FIG. 8 illustrates a cross-sectional view of the FET in an operation of forming the sacrificial layer according to one or more aspects of the present disclosure.
Figure 9:
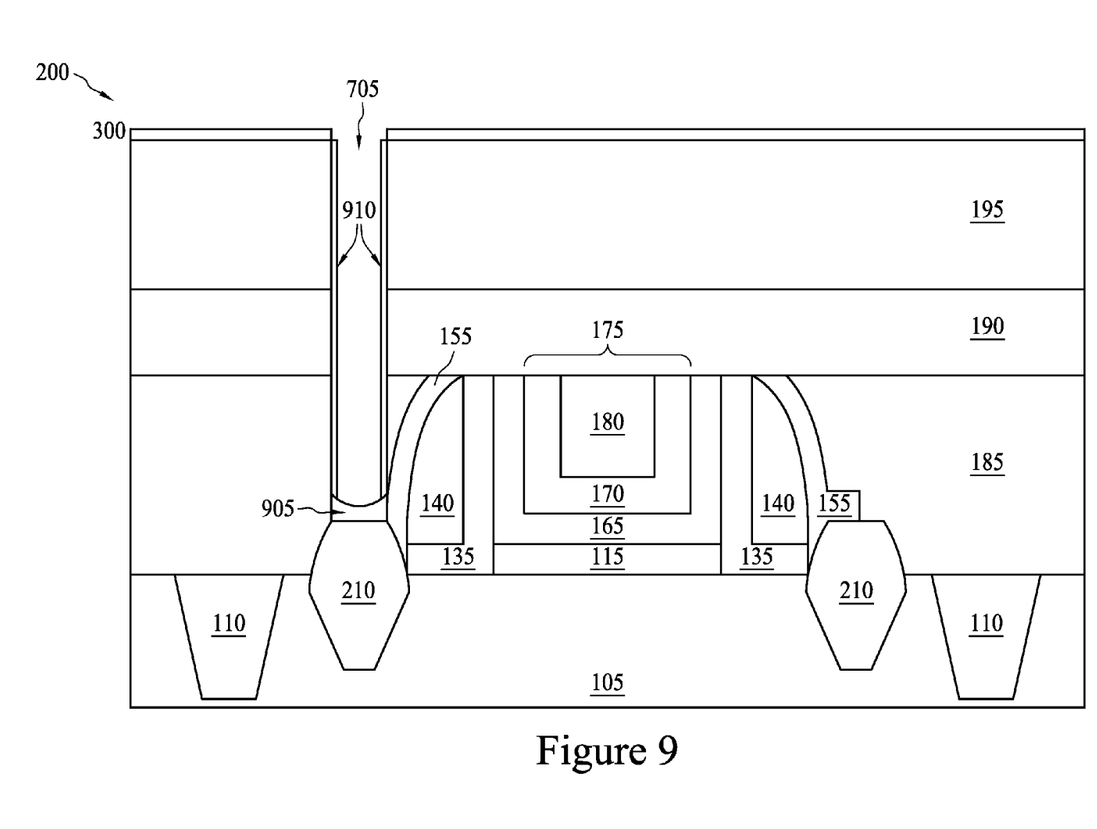
FIG. 9 illustrates a cross-sectional view of the another FET in an operation of forming the sacrificial layer according to one or more aspects of the present disclosure.

The specified dry etching gas are provided to the second dry etching operation in order to have a chemical reaction with the residue film 610 produced in FIG. 6 and the silicide contacts 150, and further forming the sacrificial layer 805 through the chemical reaction. In this embodiment, the gases $H_2$ and $N_2$ are selected for the second dry etching operation because the gases $H_2$ and $N_2$ are capable of reacting with the CHO-based polymer to generate products including $CO_x$, $H_2O$ and $NH_x$. The products $CO_x$ and $H_2O$ may be in gas phase and be pumped out from the plasma chamber 520. A portion of the product $NH_x$ remains on the bottom or sidewall surface of the contact hole 605. The CHO-based polymer thin film then is gradually consumed by reacting with the gases $H_2$ and $N_2$ under plasma environment in the chamber 520. In other words, the composition of the thin residue film 610 formed in FIG. 4 may be altered to form another residue film 810, as illustrated in FIG. 8. The residue film 810 may include the CHO-based polymer and $NH_x$. During the second dry etching operation, the product $NH_x$ may have a further chemical reaction with the silicon of the silicide contacts 150 and the source/drain regions 130, 145. Similarly, as depicted in FIG. 9, for the FET 200 during the second dry etching operation, the product $NH_x$ may have a further chemical reaction with the silicon of the silicide contacts 150 (not shown in FIG. 9) and the epitaxy structures 210. A sacrificial layer 905 is formed and the thin residue film 710 formed in the first dry etch stage are altered to form another residue film 910. Specifically, the sacrificial layers 805 and 905 come from chemical reaction of $NH_x$ and silicon to produce $Si(NH)_y$. Please note that x and y may be any integers according to various stoichiometries. In some embodiments, y can be in a range of from about 1 to about 10.

$Si(NH)_y$ is a final product of the second dry etching operation. $Si(NH)_y$ has a characteristic of acid resistant and thus will not be eroded by the following wet etching operation. As long as the generated sacrificial layers 805 and 905 are able to achieve the same or similar objective, the specific forming method is not limited to the above disclosed embodiment. In some embodiments, the temporary sacrificial layers 805 and 905 may be formed by utilizing an alternative etching gas. In some embodiments, the temporary sacrificial layers 805 and 905 may be formed by utilizing an alternative etchant. In some embodiments, the temporary sacrificial layers 805 and 905 may be formed according to an alternative chemical reaction. In some embodiments, the temporary sacrificial layers 805 and 905 may be sporadically formed (not shown in FIG. 6 and FIG. 7) on an inner sidewall of the contact hole 605 and the contact hole 705. In the case where the sacrificial layers 805 and 905 are built up at the sidewall of the contact hole 605 and the contact hole 705 and in proximity to the interface between the first insulating layer 185 and the second insulating layer 190, said interface may not be a leaking channel with respect to the wet etching agent subsequently introduced into the contact hole 605 and the contact hole 705.

Figure 10:
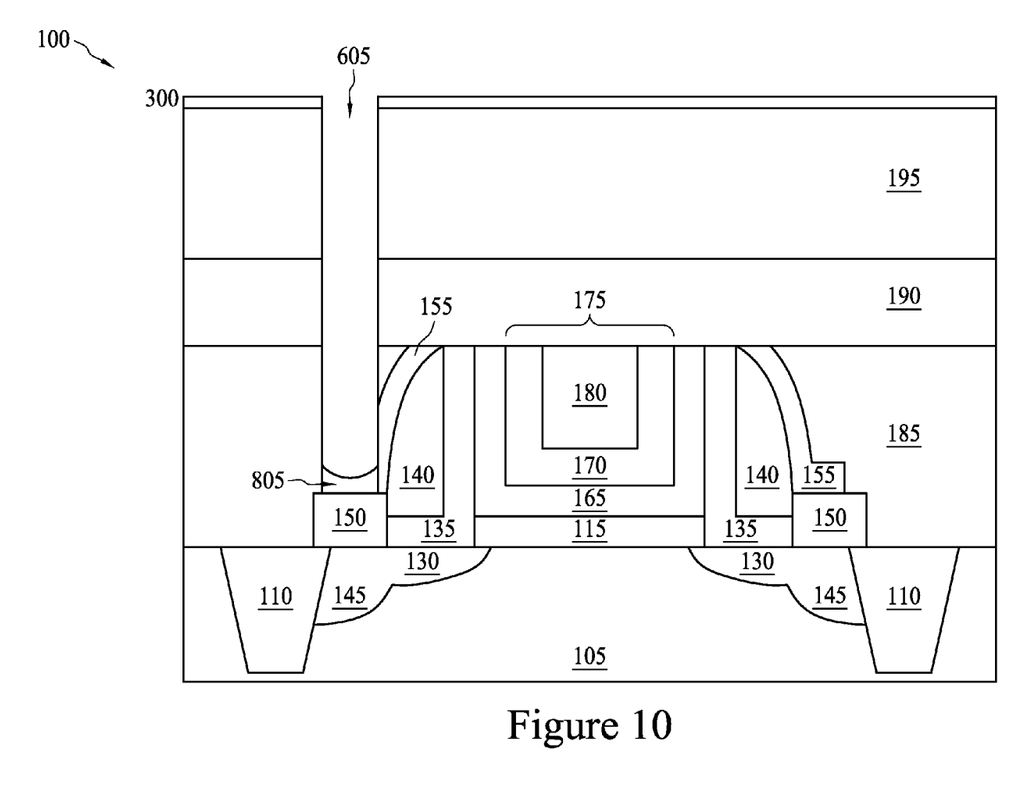
FIG. 10 illustrates a cross-sectional view of the FET in a wet etch operation according to one or more aspects of the present disclosure.
Figure 11:
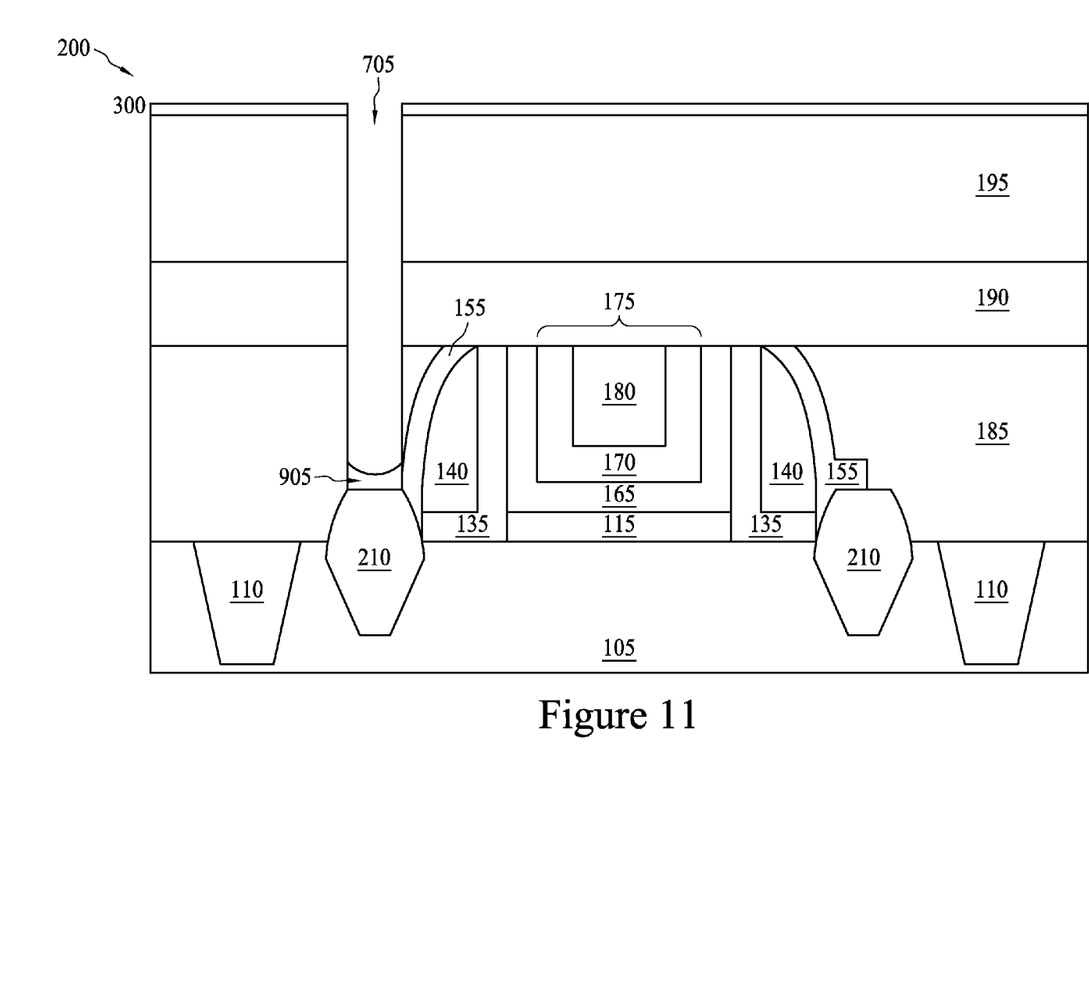
FIG. 11 illustrates a cross-sectional view of the another FET in a wet etch operation according to one or more aspects of the present disclosure.

As described above, one of the reasons to form a sacrificial layer 805 is because the dry etching operation is followed by a wet etching operation in order to remove the byproduct inevitably left over on the inner surface of the contact hole 605. The wet etching operation may damage the bottom of the contact hole to form an undercut profile or even erode the metal gate, in particular, especially when the designed feature sizes become smaller and smaller. FIG. 10 illustrates a cross-sectional view of the FET 100 in a wet etch operation according to one or more aspects of the present disclosure. Wet etch is a process that uses chemical solution to dissolve the materials on the wafer surface to achieve the desired patterns. It has several steps such as etch, rinse, and dry. In this embodiment, the wet etching operation is controlled by the etchant temperature and concentration. Also, a predefined wet etching duration may be determined based on contents of the byproduct left by the preceding dry etching operation. However, this is not a limitation of the disclosure. In practice, the wet etching operation may be controlled in accordance with different design considerations as long as the same or similar objective can be achieved. It is expressly shown that the residue film 810 of FIG. 8 is removed from the inner surface of the contact hole 605 in FIG. 10. Please note that the sacrificial layer 805 still remains intact, and therefore the silicide contact 150, the heavily doped source/drain regions 145, and the gate electrode 175 remain undamaged. Wet etching operation may be also performed upon the FET 200 as depicted in FIG. 11.

Figure 12:
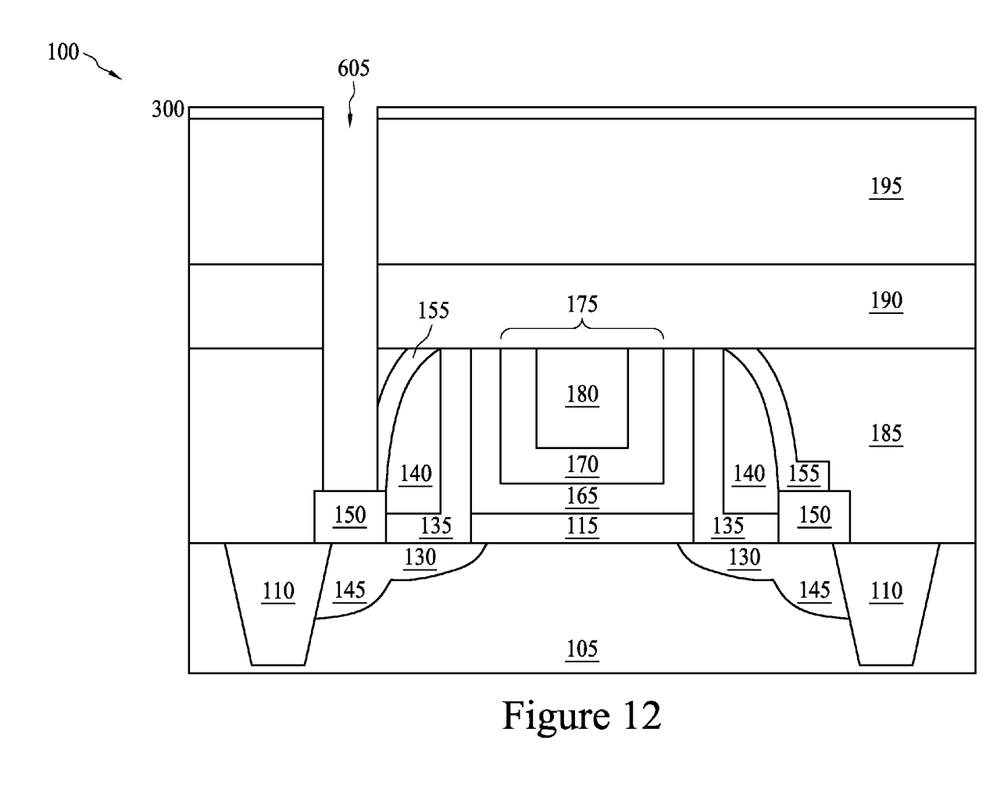
FIG. 12 illustrates a cross-sectional view of the FET in an argon sputtering operation according to one or more aspects of the present disclosure.
Figure 13:
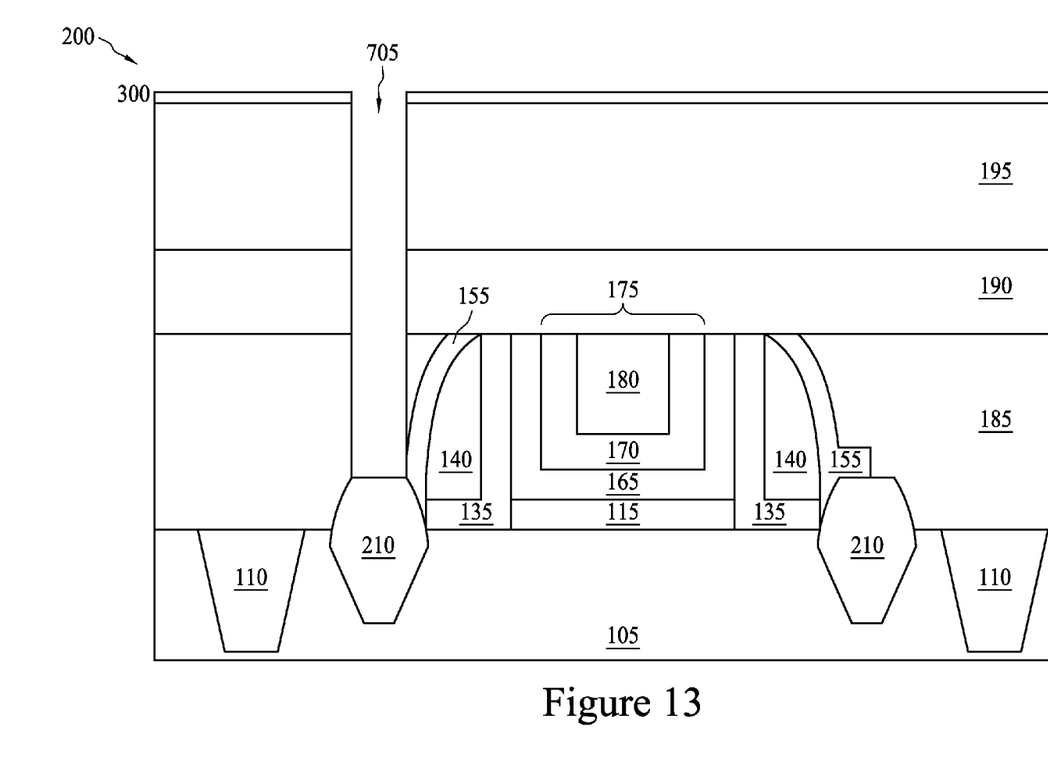
FIG. 13 illustrates a cross-sectional view of the another FET in an argon sputtering operation according to one or more aspects of the present disclosure.

The temporary sacrificial layer 805, as the name indicates, is a temporarily built layer in order to resist acid erosion during wet etch. The sacrificial layer 805 can be removed by any appropriate methods. In this embodiment, the sacrificial layer 805 is at least partially removed by argon sputtering. Argon sputtering is a pure physical etch. Argon is an inert gas; therefore, there is no chemical reaction during the operation. The sacrificial layer 805 is dislodged from the inner surface by the energetic argon ions. The etch rate of the pure physical etch normally depends on the flux and energy of the ion bombardment. The direction of the ion bombardment is substantially perpendicular to the surface of the FET 100. Therefore, the argon sputtering operation can achieve the anisotropic etch profile as shown in FIG. 12, which illustrates a cross-sectional view of the FET 100 in an argon sputtering operation according to one or more aspects of the present disclosure. The argon sputtering operation keeps dislodging the sacrificial layer 805 until a top surface of the silicide contact 150 exposes. The argon sputtering operation may be employed to at least partially remove the sacrificial layer 905 covered around the bottom the contact hole 705 of the FET 200, as depicted in FIG. 13.

The temporary sacrificial layers 805 and 905 can be removed by any other appropriate methods and is not limited to argon sputtering or even physical etch. After the top surface of the silicide contact 150, several further steps may be executed such as rinse and dry in order to clear up the contact hole 605 and the contact hole 705. In this embodiment, tungsten is used to fill the contact holes 605 and 705. Tungsten is the most commonly used metal to fill the contact holes and form the so-called plug to connect the metal layer and silicon or between different metal layers. CVD tungsten film has excellent step coverage and gap-fill capability. However, this disclosure does not intend to limit the conductive material filled in the contact holes 605 and 705 to tungsten.

A manufacturing operation pertinent to a mechanism to etch a contact hole for coupling an S/D region of a metal gate device to other devices is disclosed. Several embodiments and diagrams associated with fabrication processing of the semiconductor device are provided, and relative etching environment is illustrated as well. A dry etching gas for etching a dielectric layer is also disclosed. The dry etching gas includes $H_2$ and $N_2$, wherein the dry etching gas is capable of chemically react with a byproduct of a preceding dry etching operation. The product of the said reaction, i.e., dry etching gas and the byproduct, is then react with silicon to form an acid resistant layer. It will be understood that the method and the etching gas of the disclosure may be used for fabrication of other types of solid state devices and for improving other types of later semiconductor processing. The disclosed method protects specified locations, such as a bottom of a contact hole, from being forming an undercut profile. The disclosed method also effectively prevents a metal gate from being eroded by the acid solution penetrated from the neighboring contact hole. As a result, an overall device yield can be improved. The novel dry etching gas recipe can be employed in the proposed dry etching method and forming an erosion resistant layer. However, the dry etching gas is not limited to be used in conjunction with the dry etching operation in the same disclosure.

Some embodiments of the present disclosure provide a method of manufacturing a semiconductor device. The method includes providing a semiconductor substrate; forming a conductive region at least partially in the semiconductor substrate; forming a dielectric layer over the substrate; forming a hard mask over the dielectric layer, the hard mask having an opening over the conductive region; dry etching the dielectric layer by a first etching gas to form a recessed feature, wherein a surface of the conductive region is therefore exposed at a bottom of the recessed feature, and a byproduct film is formed at an inner surface of the recessed feature; and dry etching the dielectric layer by a second etching gas, wherein the second etching gas chemically reacts with the byproduct film and the conductive region, and a sacrificial layer is therefore built up around the bottom of the recessed feature.

In some embodiments of the present disclosure, the first etching gas includes fluoride-containing chemicals.

In some embodiments of the present disclosure, the first etching gas includes $CF_4$ and $CHF_3$.

In some embodiments of the present disclosure, the second etching gas includes $H_2$ and $N_2$.

In some embodiments of the present disclosure, a flow rate of the $H_2$ gas is in a range of from about 80 to about 150 sccm.

In some embodiments of the present disclosure, a flow rate of the $N_2$ gas is in a range of from about 80 to about 150 sccm.

In some embodiments of the present disclosure, the sacrificial layer includes $Si(NH)_x$, wherein x is in a range of from about 1 to about 10.

In some embodiments of the present disclosure, the method further includes wet etching the recessed feature by using a wet etching agent.

In some embodiments of the present disclosure, the method further includes removing a portion of the sacrificial layer.

Some embodiments of the present disclosure provide a method of manufacturing a semiconductor device. The method includes providing a semiconductor substrate; forming a silicon epitaxy region at least partially in the semiconductor substrate; forming a dielectric layer over the substrate; forming a hard mask over the dielectric layer; dry etching the dielectric layer by an etching gas to form a recessed feature, wherein a surface of the silicon epitaxy region is therefore exposed at a bottom of the recessed feature; building up a sacrificial layer around the bottom of the recessed feature; and wet etching the recessed feature by using a wet etching agent; wherein the sacrificial layer is corrosion resistant against the wet etching agent.

In some embodiments of the present disclosure, the method further includes removing a portion of the sacrificial layer.

In some embodiments of the present disclosure, the silicon epitaxy region is a source or a drain region, and the recessed feature is a contact hole.

In some embodiments of the present disclosure, the building up the sacrificial layer around the bottom of the recessed feature includes building up the sacrificial layer to cover the exposed surface of the silicon epitaxy region and a boundary between the dielectric layer and the silicon epitaxy region.

In some embodiments of the present disclosure, the etching gas includes fluoride-containing chemicals.

In some embodiments of the present disclosure, a byproduct film is formed at an inner surface of the recessed feature, and the building up the sacrificial layer includes providing a reaction agent to the recessed feature to react with the byproduct film and the exposed surface of the silicon epitaxy region.

In some embodiments of the present disclosure, the reaction agent includes $H_2$ and $N_2$.

In some embodiments of the present disclosure, the byproduct film includes polymer, and the sacrificial layer includes $Si(NH)_x$, with x being in a range of from about 1 to about 10.

Some embodiments of the present disclosure provide a dry etching gas for etching a dielectric layer, the dry etching gas comprising $H_2$ and $N_2$, wherein the dry etching gas is capable of chemically react with a byproduct of a preceding dry etching operation and with silicon to form an acid resistant layer.

In some embodiments of the present disclosure, the preceding dry etching operation employs a preceding dry etching gas comprising fluoride-containing chemicals.

In some embodiments of the present disclosure, the byproduct includes polymer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    providing a semiconductor substrate;
    forming a conductive region at least partially in the semiconductor substrate;
    forming a dielectric layer over the substrate;
    forming a hard mask over the dielectric layer, the hard mask having an opening over the conductive region;
    dry etching the dielectric layer by a first etching gas to form a recessed feature, wherein a surface of the conductive region is therefore exposed at a bottom of the recessed feature, and a byproduct film is formed at an inner surface of the recessed feature; and
    dry etching the dielectric layer by a second etching gas, wherein the second etching gas chemically reacts with the byproduct film and the conductive region, and a sacrificial layer is therefore built up around the bottom of the recessed feature.

2. The method of claim 1, wherein the first etching gas comprises fluoride-containing chemicals.

3. The method of claim 2, wherein the first etching gas comprises $CF_4$ and $CHF_3$.

4. The method of claim 1, wherein the second etching gas comprises $H_2$ and $N_2$.

5. The method of claim 4, wherein a flow rate of the $H_2$ gas is in a range of from about 80 to about 150 sccm.

6. The method of claim 4, wherein a flow rate of the $N_2$ gas is in a range of from about 80 to about 150 sccm.

7. The method of claim 1, wherein the sacrificial layer comprises $Si(NH)_x$, wherein x is in a range of from about 1 to about 10.

8. The method of claim 1, further comprising wet etching the recessed feature by using a wet etching agent.

9. The method of claim 1, further comprising removing a portion of the sacrificial layer.

10. A method of manufacturing a semiconductor device, the method comprising:
provoiding a semiconductor substrate;
forming a silicon epitaxy region at least partially in the semiconductor substrate;
forming a dielectric layer over the substrate;
forming a hard mask over the dielectric layer;
dry etching the dielectric layer by an etching gas to form a recessed feature, wherein a surface of the silicon epitaxy region is therefore exposed at a bottom of the recessed feature;
building up a sacrificial layer around the bottom of the recessed feature; and
wet etching the recessed feature by using a wet etching agent;
wherein the sacrificial layer is corrosion resistant against the wet etching agent.

11. The method of claim 10, further comprising removing a portion of the sacrificial layer.

12. The method of claim 10, wherein the silicon epitaxy region is a source or a drain region, and the recessed feature is a contact hole.

13. The method of claim 12, wherein the building up the sacrificial layer around the bottom of the recessed feature comprises building up the sacrificial layer to cover the exposed surface of the silicon epitaxy region and a boundary between the dielectric layer and the silicon epitaxy region.

14. The method of claim 10, wherein the etching gas comprises fluoride-containing chemicals.

15. The method of claim 10, wherein a byproduct film is formed at an inner surface of the recessed feature, and the building up the sacrificial layer comprises providing a reaction agent to the recessed feature to react with the byproduct film and the exposed surface of the silicon epitaxy region.

16. The method of claim 15, wherein the reaction agent comprises $H_2$ and $N_2$.

17. The method of claim 16, wherein the byproduct film comprises polymer, and the sacrificial layer comprises $Si(NH)_x$ with x being in a range of from about 1 to about 10.

18. A method of manufacturing a semiconductor device, the method comprising:
providing a semiconductor substrate;
forming a silicide region at least partially in the semiconductor substrate;
forming a dielectric layer over the substrate;
using a first etching gas to etch the dielectric layer to form a recessed feature connected to the silicide region, wherein a first residue film is formed at an inner surface of the recessed feature; and
reacting a second etching gas with the first residue film to form a second residue film to at least partially replace the first residue film, wherein at least a portion of the second residue film further reacts with the silicide region to form a sacrificial layer substantially on the silicide region.

19. The method of claim 18, further comprising performing a wet etching operation to selectively remove the second residue film.

20. The method of claim 18, further comprising removing the sacrificial layer.

* * * * *